United States Patent
Ramaraju et al.

(10) Patent No.: US 8,537,625 B2
(45) Date of Patent: Sep. 17, 2013

(54) MEMORY VOLTAGE REGULATOR WITH LEAKAGE CURRENT VOLTAGE CONTROL

(75) Inventors: Ravindraraj Ramaraju, Round Rock, TX (US); Shayan Zhang, Austin, TX (US); Kenneth R. Burch, Austin, TX (US); Charles E. Seaberg, Austin, TX (US); Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 239 days.

(21) Appl. No.: 13/045,294

(22) Filed: Mar. 10, 2011

(65) Prior Publication Data

US 2012/0230126 A1 Sep. 13, 2012

(51) Int. Cl.
*G11C 11/412* (2006.01)

(52) U.S. Cl.
USPC ............... 365/189.06; 365/154; 365/210.1; 365/210.12; 365/226

(58) Field of Classification Search
USPC .................................................. 365/210.12
See application file for complete search history.

(56) References Cited

U.S. PATENT DOCUMENTS

| | | | |
|---|---|---|---|
| 5,552,740 A | 9/1996 | Casper | |
| 5,761,143 A * | 6/1998 | Fukuda | 365/210.1 |
| 5,889,702 A * | 3/1999 | Gaultier et al. | 365/185.2 |
| 6,021,500 A | 2/2000 | Wang et al. | |
| 6,111,394 A | 8/2000 | Casper | |
| 6,281,744 B1 | 8/2001 | Kang | |
| 6,320,795 B1 | 11/2001 | Balamurugan et al. | |
| 6,380,799 B1 | 4/2002 | Chung et al. | |
| 6,560,139 B2 | 5/2003 | Ma et al. | |
| 6,801,470 B2 | 10/2004 | Clark et al. | |
| 6,836,179 B2 | 12/2004 | Mizuno et al. | |
| 6,856,555 B2 * | 2/2005 | Fujimoto | 365/189.07 |
| 6,906,582 B2 | 6/2005 | Kase | |
| 6,909,320 B2 | 6/2005 | Chan et al. | |
| 6,933,772 B1 | 8/2005 | Banerjee et al. | |
| 7,042,274 B2 | 5/2006 | Hazucha et al. | |
| 7,055,007 B2 | 5/2006 | Flautner et al. | |
| 7,061,820 B2 | 6/2006 | Deng | |
| 7,064,601 B2 | 6/2006 | Kwak et al. | |
| 7,080,269 B2 | 7/2006 | Baumgartner et al. | |
| 7,085,943 B2 | 8/2006 | Chun et al. | |
| 7,091,712 B2 | 8/2006 | Miller et al. | |
| 7,099,230 B1 | 8/2006 | Tran | |
| 7,110,317 B2 | 9/2006 | Song et al. | |
| 7,125,842 B2 | 10/2006 | Kawabe et al. | |
| 7,126,861 B2 | 10/2006 | Hose, Jr. et al. | |
| 7,135,842 B2 | 11/2006 | Banerjee et al. | |
| 7,155,621 B2 | 12/2006 | Dai | |

(Continued)

OTHER PUBLICATIONS

Bhavnagarwala et al.; "A Pico-Joule Class, 1 GHGz, 32 KByte x 64b DSP SRAM with Self Reserve Bias"; 2003 Symposium on VLSI Circuits Digest of Technical Papers 2003; pp. 251-252.

(Continued)

*Primary Examiner* — Tan T. Nguyen
(74) *Attorney, Agent, or Firm* — David G. Dolezal

(57) ABSTRACT

A voltage regulator for a memory that regulates a voltage provided to the memory cells based on a measured leakage current from a second set of memory cells. In one embodiment, based on the measured leakage current, the voltage to the cells is raised or lowered to control the amount of leakage current from the cells.

21 Claims, 3 Drawing Sheets

(56) References Cited

U.S. PATENT DOCUMENTS

| | | | |
|---|---|---|---|
| 7,161,844 B2 * | 1/2007 | Sarin et al. | 365/189.03 |
| 7,209,395 B2 | 4/2007 | Hsu et al. | |
| 7,235,959 B2 | 6/2007 | Sicard | |
| 7,248,494 B2 * | 7/2007 | Oh et al. | 365/148 |
| 7,253,595 B2 | 8/2007 | Oddoart et al. | |
| 7,262,631 B2 | 8/2007 | Chong | |
| 7,268,524 B2 | 9/2007 | Kase et al. | |
| 7,366,036 B2 | 4/2008 | Cheng et al. | |
| 7,385,435 B2 | 6/2008 | Pham et al. | |
| 7,400,523 B2 | 7/2008 | Houston | |
| 7,400,545 B2 | 7/2008 | Ramaraju et al. | |
| 7,414,457 B2 | 8/2008 | Ogawa et al. | |
| 7,423,416 B1 | 9/2008 | Quinones et al. | |
| 7,432,693 B2 | 10/2008 | Enjalbert | |
| 7,439,718 B2 | 10/2008 | Rozen et al. | |
| 7,441,137 B1 | 10/2008 | Mimberg | |
| 7,446,759 B2 | 11/2008 | Yamamoto | |
| 7,453,756 B2 | 11/2008 | Moyer et al. | |
| 7,460,429 B2 | 12/2008 | Schoenfeld | |
| 7,463,013 B2 | 12/2008 | Plojhar | |
| 7,479,824 B2 | 1/2009 | Bushman et al. | |
| 7,523,373 B2 | 4/2009 | Russell et al. | |
| 7,533,226 B2 | 5/2009 | Flautner et al. | |
| 7,539,878 B2 | 5/2009 | Vaglica | |
| 7,554,312 B2 | 6/2009 | Fulton et al. | |
| 7,609,047 B2 | 10/2009 | Ravichandran | |
| 7,619,440 B2 | 11/2009 | Amedeo et al. | |
| 7,638,903 B2 | 12/2009 | Pelley, III et al. | |
| 7,706,200 B2 | 4/2010 | Chi | |
| 7,825,720 B2 | 11/2010 | Ramaraju et al. | |
| 2008/0158939 A1 | 7/2008 | Chen et al. | |
| 2009/0096433 A1 | 4/2009 | Gerber et al. | |
| 2009/0203410 A1 | 8/2009 | Lu | |
| 2009/0285046 A1 | 11/2009 | Ehrenreich et al. | |
| 2009/0323401 A1 | 12/2009 | Huang et al. | |
| 2010/0207688 A1 | 8/2010 | Ramaraju et al. | |
| 2012/0026805 A1 * | 2/2012 | Tang et al. | 365/189.07 |

OTHER PUBLICATIONS

Chang et al.; "The 65-nm 16-MB Shared On-Die L3 Cache for the Dual-Cone Intel Xeon Processor 7100 Series"; IEEE Journal fo Solid State Circuits; APr. 2007l pp. 846-851; vol. 42, No. 4; IEEE.

Chen et al.; " A0.6 V Dual-Rail Compiler SRAM Design on 45 nm CMOS Technology With Adaptive SRAM Power for Lower VDD-min VLSIs"; IEEE Journal of Solid State Circuits; Apr. 2009; pp. 1209-1215; vol. 44, No. 4; IEEE.

Kellah et al.; "A 256-Kb Dual-Vcc SRAM Building Block in 65-nm CMOS Process With Actively Clamped Sleep Transistor"; IEEE Journal of Solid-State Circuits; Jan. 2007; pp. 233-242; IEEE.

Nii et al.; "A 90 nm Low Power 32K-Byte Embedded SRAM with Gate Leakage Suppression Circuit for Mobile Applications"; 2003 Symposium on VLSI Circuits Digest of Technical Papers; 2003; pp. 247-250.

Sackinger et al.; "A High-Swing, High-Impedance MOS Cascode Circuit"; IEEE Journal of Solid State Circuits; Feb. 1990; pp. 289-298; vol. 25 No. 1; IEEE.

Takashima et al.; "Standby/Active Mode Logic for Sub-1-V Operation ULSI Memory"; IEEE Journal of Solid State Circuits; Apr. 1994; pp. 441; vol. 29, No. 4; IEEE.

Tschanz et al.; "Dynamic Sleep Transistor and Body Bias for Active Leakage Power Control of Microprocessors"; IEEE Journal of Solid State Circuits; Nov. 2003; pp. 1838-1845; vol. 38, No. 11, IEEE.

Vangal et al.; "An 80-Tile Sub-100-W TeraFLOPS Processor in 65-nm CMOS"; IEEE Journal of Solid-State Circuits; Jan. 2008; pp. 29-41; vol. 43, No. 1; IEEE.

Wang et al.; "A 1.1 GHz 12 uA/Mb-Leakagae SRAM Design in 65 nm Ultra-Low-Power CMOS Technology With Integrated Leakage Reduction for Mobile Applications"; IEEE Journal of Solid-State Circuits; Jan. 2008; pp. 172-179; vol. 43, No. 1; IEEE.

Wang et al.; "A 4.0 Ghz 291 Mb Voltage-Scalable SRAM Design in a 32 nm High-k + Metal-Gate CMOS Technology With Integrated Power Management"; IEEE Journal of Solid-State Circuits; Jan. 2010; pp. 103-110; vol. 45, No. 1; IEEE.

Zhang et al.; "Low-Power SRAMs in Nanoscale CMOS Technologies"; IEEE Transactions on Electron Devices; pp. 145-151; vol. 55, No. 1; IEEE.

U.S. Appl. No. 12/622,277, filed Nov. 19, 2009.
U.S. Appl. No. 12/714,079, filed Feb. 26, 2010.
U.S. Appl. No. 12/786,916, filed May 25, 2010.
U.S. Appl. No. 12/843,547, filed Jul. 26, 2010.
U.S. Appl. No. 12/850,533, filed Aug. 4, 2010.
U.S. Appl. No. 12/853,106, filed Aug. 9, 2010.
U.S. Appl. No. 13/020,565, filed Feb. 3, 2011.
U.S. Appl. No. 12/846,042, filed Jul. 29, 2010.

* cited by examiner

MEMORY VOLTAGE REGULATOR WITH LEAKAGE CURRENT VOLTAGE CONTROL

BACKGROUND OF THE INVENTION

1. Field of the Invention

This invention relates in general to memories and more specifically to voltage regulators for memories with leakage current voltage control.

2. Description of the Related Art

Memories are utilized by data information systems for storing information that can be retrieved for later use. Examples of memories include caches, computer memories, and stand alone memories. Voltage regulators may be used to regulate a voltage provided to a memory.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In one example, the regulated voltage for a memory is controlled by measured leakage current of cells of the memory to reduce the leakage current in other cells of the memory by reducing the voltages across the other memory cells of the memory, or by controlling a voltage provided to a memory cell.

Leakage current from a memory cell can cause unneeded power consumption in a memory, especially during an inactive state or low power mode. Typically, leakage current can be reduced by lowering the voltages across the memory cells of a memory. In ideal settings, memories can be designed where the voltages across the cells are set to produce a tolerable amount of leakage current. However, manufacturing variances and certain operating conditions can cause variations in the amount of leakage current from a memory cell. Thus, by controlling the voltage across a memory cell of the cells of the memory based upon the measured leakage current of other cells of the memory, adjustments can be made to the voltages across the cells to account for those variations in manufacturing and operating conditions.

Figure 1:
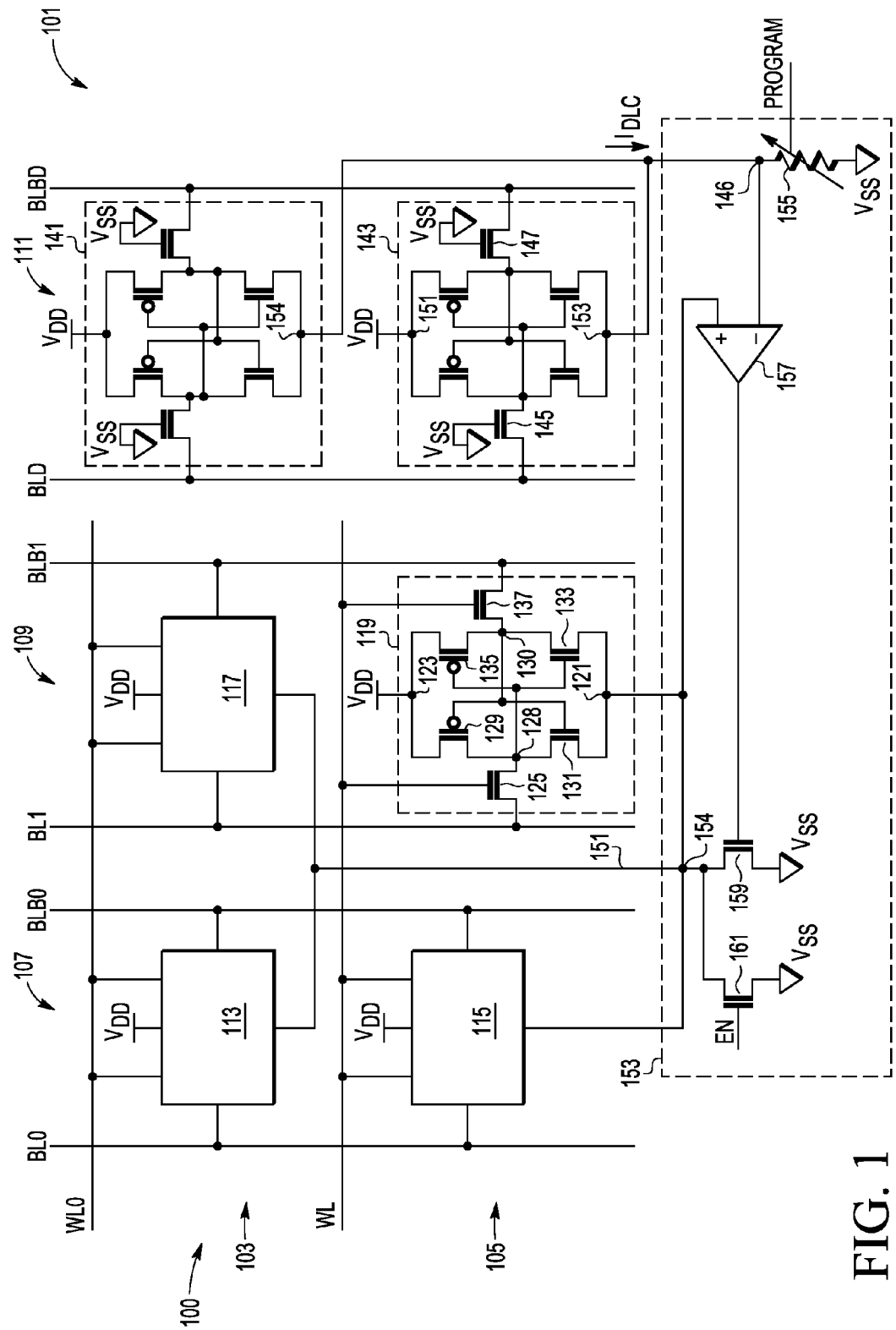
FIG. 1 is a circuit diagram of a portion of a memory according to one embodiment of the present invention.

FIG. 1 is a circuit diagram of a portion of a memory 100 that includes circuitry for controlling the voltage across a memory cell to control leakage current from the cell based on a measured leakage current of other cells of the memory. Memory 100 includes a memory array 101 that includes memory cells 113, 117, 141, 115, 119, and 143 arranged in rows 103 and 105 and columns 107, 109, and 111. In the embodiment shown, cells 113, 117, 141, 115, 119, and 143 are 6 transistor (6T) single-port SRAM memory cells. However, memories according to other embodiments may have other types of memory cells such as for example, 8T dual-port SRAM cells, one transistor one capacitor dynamic memory cells, and one transistor split-gate flash memory cells.

As shown in FIG. 1, 6T SRAM cell 119 includes a high voltage terminal 123 that is connected to a VDD power supply terminal and a low voltage terminal 121 that is connected to a regulated voltage node 154. In one embodiment, VDD is at 1.2 volts, but may be at other voltages in other embodiments. Coupled between terminals 121 and 123 are two inverters that are cross coupled. One inverter is made of transistors 133 and 135 and the other inverter is made of transistors 129 and 131. The gates (control terminals of a FET) of transistors 129 and 131 are connected to storage node 130 and the gates of transistors 135 and 133 are connected to storage node 128. The sources (one type of current terminal of a FET) of PFET transistors 129 and 135 are connected to high voltage terminal 123 and the drains of NFET transistors 131 and 133 are connected to low voltage terminal 121. Cells 113, 117, and 115 include similar circuitry that is not shown in FIG. 1.

In operation, cell 119 is biased to store a high voltage at either node 128 or 130 (with a low voltage at the other node) depending upon the desired logical value (either a 1 or 0) to be stored in the cell. The desired value is written to cell 119 by the assertion of word line (WL) connected to the cell that makes conductive programming transistors 125 and 137 to couple the complementary bit lines BL1 and BLB1 to the respective storage nodes of the cell (128 and 130) respectively. The logical value to be stored in the cell is then controlled by which one of the two complimentary bit lines (BL1 and BLB1) is driven to a high voltage and which one is driven to a low voltage by a memory controller (not shown). When the word line is deasserted by a word line driver (not shown), the values of the voltage node remain latched by the cross coupled inverters. The value of the storage nodes can be read subsequently by coupling the bit lines connected to the cell to a sense amplifier (not shown) where assertion of the word line connected to the cell connects the respective storage node to the respective bit line to be read by the sense amplifier. However, other memories may be configured to be written to and/or read from differently in other embodiments and may also store data differently in other embodiments. Also in other embodiments, a memory array may include many more rows and columns of memory cells.

When data is being stored in memory cell 119, one of storage nodes 128 and 130 is at a high voltage value and the other is at a low voltage value. Accordingly, the gate voltage of one transistor of the two transistors of an inverter will be at a value such that the transistor should be non-conductive. For example, if the voltage at node 128 is at a low value (to store one logical value), then transistor 133 should ideally be non-conductive. If the voltage at node 128 is a high value (to store the other logical value), then transistor 135 should be non-conductive. Accordingly, because one transistor of each inverter should be non-conductive when either value is stored in a cell, ideally there should be no leakage current from the high voltage terminal (123) to the low voltage terminal (121) when data is being stored in a memory cell.

However, most memory cells exhibit leakage current from the high voltage terminal (123) to the low voltage terminal (121), which results in unwanted power consumption during operation. For memory cells such as an SRAM cell, the amount of current leakage can be reduced by reducing the voltage across a memory cell. With an SRAM memory cell, the voltage across a memory cell is the voltage differential between high voltage terminal (123) and low voltage terminal (121).

Memory 100 includes a voltage regulator 153 that regulates the voltage of regulated node 154 based upon a measured leakage current of dummy memory cells of column 111 of array 101. Regulated node 154 is connected to the low voltage terminals of cells 113, 115, 117, and 119. By raising or lowering the voltage of node 154, regulator 153 lowers or raises the voltage across the memory cell of cells 113, 115, 117, and 119.

In the embodiment shown, cells 141 and 143 located in column 111 are dummy cells in that no retrievable data is stored in those cells. Cells 141 and 143 are 6T SRAM cells similar to cells 113, 117, 115, and 119 except that the gates of the programming transistors (transistors 145 and 147 of cell 143) are tied to ground such that the NFET programming transistors are non-conductive, isolating the cross coupled inverters of the cells from the bit lines BLD and BLBD. The values "stored" in the dummy cells may randomly go to different states during power up due to mismatches in the cell.

The low voltage terminals of each dummy cell of column 111 are tied to node 146. During operation of memory 100, a total leakage current ($I_{DLC}$) of the cells of column 111 is provided to programmable resistor 155. Because the dummy cells are formed on the same integrated circuit as the cells of columns 107 and 109, the leakage current from each dummy cell should be similar in magnitude to the leakage current produced by each cell of column 107 and 109 due to the same manufacturing conditions and the same operating conditions (e.g. temperature, power supply voltage).

The leakage current $I_{DLC}$ flowing through resistor 155 generates a voltage at node 146. Regulator 153 includes an operational amplifier 157 that has an output connected to the gate of regulating transistor 159 to control the conductivity of transistor 159. Node 146 is connected to the inverting input of operational amplifier 157 and regulated node 154 is connected to the non-inverting input of operational amplifier 157.

During the operation of memory 100, the voltage of node 154 is set by the voltage of node 146. Accordingly, the voltage of node 154 is controlled by the amount of leakage current $I_{DLC}$ as reflected by the voltage at node 146. Thus, if the leakage current increases during operation or is at a level that is higher than desired, the voltage at node 146 rises which causes operational amplifier 157 to decrease the voltage at the gate of transistor 159 (which causes transistor 159 to become less conductive) to raise the voltage at node 154 to match the voltage of node 146. Raising the voltage at node 154 decreases the voltages across the cells of columns 107 and 109 to lower the leakage current. If the measured leakage current $I_{DLC}$ is lower than designed, then operational amplifier 157 raises the voltage at the gate of transistor 159 to lower the voltage of node 154.

In one embodiment, the value of resistor 155 is programmed by the PROGAM signal. In one embodiment, the PROGRAM signal is set by a processor (not shown) during operation. In other embodiments, the value of the PROGRAM signal is non-volatily stored in memory during manufacture. In embodiments where the program voltage is programmable during operation, the resistive values may be changed with a change operating mode of the memory to adjust the voltage of node 154. For example, during a normal operating mode, the resistive value would be lower (than in a low power mode) and the voltage of node 154 would be lower such that the voltages across the cells are higher. In a lower power mode, a higher resistive value would raise the voltage of node 154 to lower the voltages across the cells for the same amount of leakage current. In some embodiments, resistor 155 has a fixed resistive value.

In one embodiment, the value of programmable resistor is set to such that node 154 is biased at 200 mVolts when leakage current $I_{DLC}$ is at its designed value. Thus, if the leakage current is higher that its designed value, then the voltage of node 154 will increase to reduce the leakage current to its designed value. However, the "ideal" regulated voltage of node 154 may be of other values in other embodiments. In one example where a column of memory 100 includes 128 bits, the leakage current is approximately 10 nA/bit, and voltage regulator 153 can provide a 200 mVolt change, the resistance value of resistor 155 is between 80-156 KOhms. Other values for resistor 155 can be used in other embodiments.

Regulator 153 includes an enabling transistor 161 to disable the leakage current control feature of node 154. When the enable signal EN is asserted at a high voltage level, the NFET transistor 161 is conductive to pull node 154 to system ground. Thus, with regulator 153 disabled, the voltage across the cells is VDD.

In some embodiments, the enable signal is asserted when memory 100 is in a normal operating mode. In some embodiments, memory 100 can only be written to or read from when transistor 161 is conductive. When the memory is not being accessed, the EN signal is deasserted. However, in other embodiments, memory 100 can be written to and read from when transistor 161 is non-conductive.

Figure 2:
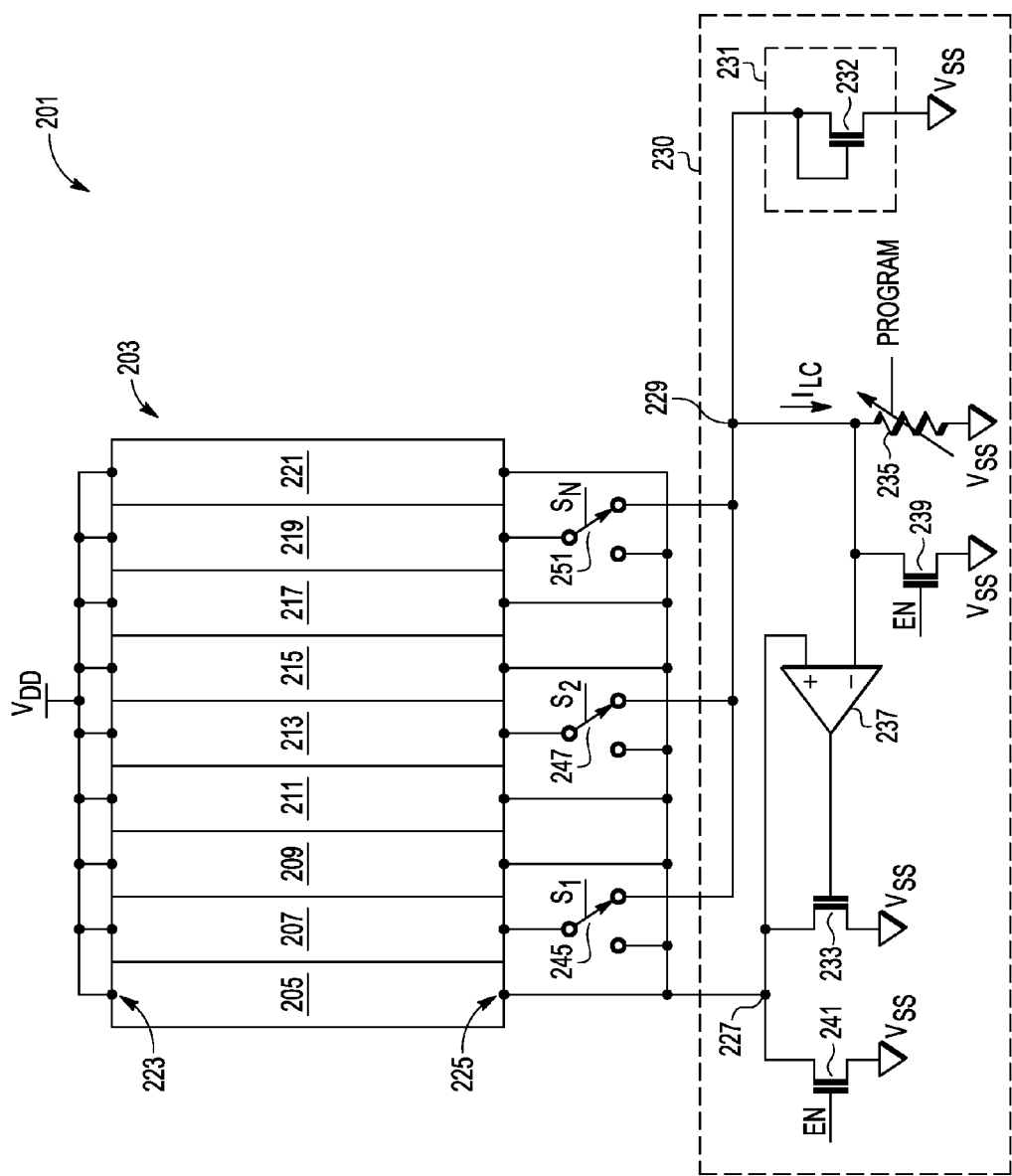
FIG. 2 is a circuit diagram of a portion of a memory according to another embodiment of the present invention.

FIG. 2 is a circuit diagram of a portion of a memory according to another embodiment of the present invention. In this embodiment, leakage current is measured across columns of cells that are used to store retrievable data. In the embodiment shown, array 203 includes columns 205, 207, 209, 211, 213, 215, 217, 219, and 221, each with memory cells arranged in rows. In FIG. 2, the cells of the rows are not shown. In one embodiment, the cells of memory 203 are 6T SRAM cells, but may be of other types of memory cells in other embodiments.

In the embodiment shown, the high voltage terminals of each cell of the columns of array 203 are connected to a VDD power supply terminal. The low voltage terminal of each cell of columns 205, 209, 211, 215, 217, and 221 are connected to regulated node 227. The low voltage terminals of the cells of column 207 are connected to switch 245, the low voltage terminals of the cells of column 213 are connected to switch 247, and the low voltage terminals of the cells of column 219 are connected to switch 251. Switches 245, 247, and 251 can selectively couple the low voltage terminals of each of its associative cells to node 229 or node 227, depending upon the state of control signals S1, S2, and SN respectively. In one embodiment, switches 245, 247, and 251 may be implemented as fuses.

Regulator 230 includes an operational amplifier circuit 237 with an output connected to the gate of regulating transistor 233 to control the voltage of node 227 based upon the leakage current ($I_{LC}$) from the memory cells of selected columns (207, 213, and/or 219) of array 203, as measured by the voltage across programmable resistor 235 at node 229. Node 229 is connected to the inverting input of operational amplifier circuit 237. Node 227 is connected to the non-inverting input of amplifier circuit 237.

In response to an increase in the measured leakage current $I_{LC}$, as indicated by an increase in voltage at node 229, amplifier circuit 237 decreases the voltage to the gate of transistor 233 to increase the voltage at node 227. Increasing the voltage at node 227 decreases the voltages across the memory cells to decrease the leakage current of those memory cells. In response to a decrease in measured leakage current $I_{LC}$, amplifier circuit 237 increases the voltage at the gate of transistor 233 to decrease the voltage at node 227, thereby increasing the voltages across the memory cells.

The ability to individually couple columns 207, 213, and 219 to programmable resistor 235 may provide some advantages in some embodiments. First, it may allow for a smaller value resistor 235 to be used to save area. For instance, with two columns coupled to resistor 235 at node 229, the value of resistor 235 can be reduced in half for the same regulated voltage at node 227. Second, the random local fluctuation of the measured leakage current $I_{LC}$ can be reduced by adding more measurement columns and so leakage tracking will be based on its average values. And last, to save a dummy column 111 from memory 100 in FIG. 1, a repaired column, damaged column, or a repairable column can be selected as a leakage current $I_{LC}$ measurement column as long as its leakage characteristic remains on target.

Regulator 230 includes enable transistors 241 and 239 that are made conductive by an asserted high voltage of the EN signal to pull both nodes 227 and 229 to system ground. Pulling nodes 227 and 229 to system ground makes the voltages across the memory cells of array 203 VDD.

Regulator 230 also includes a voltage clamp circuit 231 to prevent the voltage of node 229 from rising above a particular voltage level to maintain a particular data retention margin across the memory cells selectively coupled to node 229 via switches 245, 247 and/or 251. Because the voltage at node 229 is dependent upon the leakage current $I_{LC}$, the voltage of node 229 is clamped by circuit 231 in case the leakage current $I_{LC}$ rises above a particular point. In one embodiment, the clamp voltage is 6.0 V to provide a read voltage margin of 6.0 V, but other embodiments may clamp at other voltages.

In one embodiment, approximately 10% or less of the columns of array 203 would be connectable to node 229. The more columns that are connected to node 229, the lower the resistance value of resistor 235. In one example where 10 columns of 128 bits per column are coupled to node 229, the leakage current is approximately 10 nA/bit, and voltage regulator 230 can provide a 200 mVolt change, the resistance value of resistor 235 is between 8-16 KOhms. In one embodiment, switches 245, 247, and 251 are not included. In those embodiments, the low voltage terminals of the cell of those columns (207, 213, and 219) are physically connected to node 229.

One advantage of the circuit of FIG. 2 is that the cells of the columns used to measure the leakage current can also store retrievable data. Thus, the memory of FIG. 2 takes up less space than the memory of FIG. 1 and consumes less power because it does not include dummy cells which take up space and consume power due to leakage current.

In the embodiments of FIGS. 1 and 2, the voltage of the inverting input of the operational amplifier circuits is set with the use of a programmable resistor (e.g. 155 and 235). However, in other embodiments, the resistor may be non-programmable.

Also, in the embodiments of FIGS. 1 and 2, the voltage regulator adjusts the voltage of the low voltage terminals of the cells. However in other embodiments, the voltage of the high voltage terminal of the cells may be adjusted based upon the measured leakage current. In some embodiments, a regulating PFET transistor would be coupled between a VDD power supply terminal and the high voltage terminals of the memory cells. An operational amplifier would control the conductivity of the PFET regulating transistor. The leakage current would be measured at a first node coupled to one terminal of a resistor whose other terminal is coupled to VDD power supply terminal. The first node of the resistor would be coupled to the high voltage terminals of the cells whose leakage current is being measured. In some embodiments, the voltage of both the low voltage terminals and the high voltage terminals of the memory cells could both be changed according to the measured leakage current to adjust the voltages across the memory cells.

Figure 3:
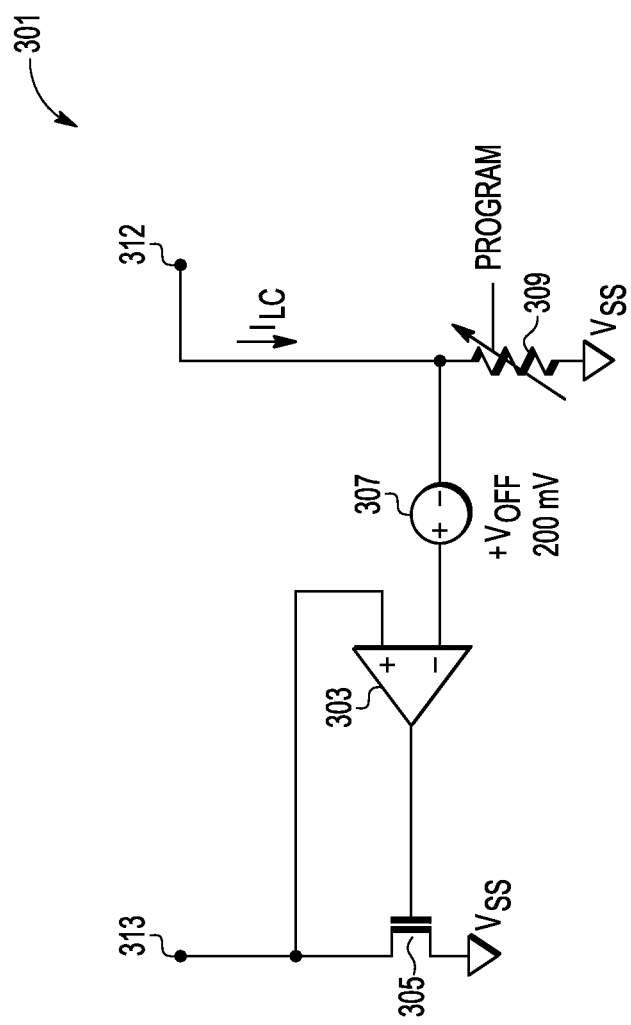
FIG. 3 is a circuit diagram of a voltage regulator of a memory according to one embodiment of the present invention.

FIG. 3 is a circuit diagram of a voltage regulator according to another embodiment of the present invention. Regulator 301 is similar to regulator 153 in FIG. 1 except that it includes an offset voltage generator 307 that has a negative terminal connected to reference node 312 and a positive terminal connected to the inverting input of operational amplifier circuit 303. Voltage generator 307 provides a voltage offset ($V_{off}$) which in one embodiment is 200 mV. Operational amplifier circuit 303 has an output that controls the voltage at the gate of regulating transistor 305 to control the voltage of node 313 to be $V_{off}$ greater than the voltage of node 312. In the embodiment shown, regulated node 313 is connected to the low voltage terminal of the memory cells of a memory array whose voltages across the cells are being regulated, and node 312 is coupled to the low voltage terminals of the cells whose leakage current ($I_{LC}$) is being measured. The voltage of node 312 is dependent upon the programmed resistive value of programmable resistor 309. In one embodiment, node 313 is similar to node 154 and node 312 is similar to node 146 of FIG. 1. In one embodiment, the value of programmable resistor 309 is set such that the voltage of node 312 is at 100 mV at the designed leakage current value. However, other values may be used.

In one embodiment, regulator 301 may include an enablement transistor (not shown) that is similar to enablement transistor 161 in FIG. 1. The enablement transistor would allow for the control of the voltages across the cells based on measured leakage current to be selectively disabled (e.g. when the memory is in full operating mode). Also, in other embodiments where memory cells (whose low voltage terminals are connected to node 312) are being used to store data, regulator 301 may also include an enabling transistor connected to node 312 (similar to transistor 239) and a voltage clamp circuit similar to voltage clamp circuit 231. Also, a regulator that includes an offset voltage generator (e.g. 307) may be used to regulate the voltage supplied to the high voltage terminals of a memory as well.

In one embodiment, using a voltage generator (e.g. 307) to generate an offset voltage allows for the voltages across the cells whose leakage current is being measured to be at a higher voltage than the voltages across the cells that are being regulated. For example, if regulator 301 were being used in memory 201, then the voltages across the cells of columns 207, 213 and 219 would be higher than that for the cells of columns 205, 209, 211, 215, 217, and 221 to ensure that the voltages across the cells whose leakage currents are being measured do not drop below the data retention margin. Also, providing an offset voltage in a voltage regulator allows for the value of resistor 309 to be smaller, thereby occupying less integrated circuit space.

Although in the embodiment shown, the voltage of the regulated node (e.g. 154, 227) is controlled to regulate the voltage across the cell of the memory cells based on measured leakage current, the regulated voltage may be used for other purposes by the memory cell in other embodiments.

In one embodiment, a circuit comprises a first plurality of memory cells. Each memory cell of the first plurality of memory cells includes a voltage supply terminal coupled to a regulated node. The circuit includes a second plurality of memory cells and a voltage regulator coupled to the regulated node to control a voltage of the regulated node. The voltage regulator comprises a leakage current measuring circuit. The leakage current measuring circuit includes a reference node for providing a measuring voltage that is dependent upon a measured leakage current of the second plurality of memory cells. The voltage regulator uses the measuring voltage in controlling the voltage of the regulated node.

In another embodiment, a circuit comprises a first plurality of memory cells. Each memory cell of the first plurality of memory cells includes a voltage supply terminal coupled to a regulated node. The circuit includes a second plurality of memory cells and a voltage regulator coupled to the regulated node to control the voltage of the regulated node to control the voltages across the cells of the first plurality of memory cells. The voltage regulator comprises a leakage current measuring circuit. The leakage current measuring circuit includes a reference node for providing a measuring voltage that is dependent upon a measured leakage current of the second plurality of memory cells. The voltage regulator uses the measuring voltage in controlling the voltages across the cells of the first plurality of memory cells to control the leakage current of the first plurality of memory cells.

In another embodiment, a method of operating a memory comprises providing a measuring voltage indicative of a measured leakage current from a first plurality of memory cells of a memory. The method includes controlling a voltage of a regulated node coupled to a voltage supply terminal of each of a second plurality of memory cells of the memory using the measuring voltage. Wherein during the controlling, the voltage of the regulated node is dependent upon the measuring voltage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
   a first plurality of memory cells, each memory cell of the first plurality of memory cells including a voltage supply terminal coupled to a regulated node;
   a second plurality of memory cells;
   a voltage regulator coupled to the regulated node to control a voltage of the regulated node, the voltage regulator comprising:
      a leakage current measuring circuit, the leakage current measuring circuit including a reference node for providing a measuring voltage that is dependent upon a measured leakage current of the second plurality of memory cells, wherein the voltage regulator uses the measuring voltage in controlling the voltage of the regulated node;
      a regulating transistor having a first current terminal coupled to the regulated node and a second current terminal coupled to a power supply node;
      an operational amplifier circuit including an inverting input coupled to the reference node, a non-inverting input coupled to the regulated node, and an output coupled to a control terminal of the regulating transistor.

2. The circuit of claim 1 wherein the voltage regulator includes a voltage offset generator coupled between the reference node and the inverting input to provide a positive voltage differential at the inverting input with respect to the reference node.

3. The circuit of claim 1 wherein the voltage regulator further comprises:
   an enablement transistor having a first current terminal coupled to the reference node, a second current terminal coupled to the power supply node, and the control terminal for receiving an enable signal, when the enable signal is at a first state, the enablement transistor is conductive to pull the measuring voltage to the voltage of the power supply node regardless of the measuring voltage;
   wherein the second plurality of memory cells are used to store retrievable data.

4. The circuit of claim 1 wherein the second plurality of memory cells are dummy memory cells.

5. The circuit of claim 1 wherein the voltage supply terminal of each of the first plurality of memory cells is characterized as a low voltage terminal of the each memory cell.

6. The circuit of claim 1 wherein the each of the first plurality of memory cells is characterized as an SRAM memory cell.

7. A circuit comprising:
   a first plurality of memory cells, each memory cell of the first plurality of memory cells including a voltage supply terminal coupled to a regulated node;
   a second plurality of memory cells;
   a voltage regulator coupled to the regulated node to control a voltage of the regulated node, the voltage regulator comprising:
      a leakage current measuring circuit, the leakage current measuring circuit including a reference node for providing a measuring voltage that is dependent upon a measured leakage current of the second plurality of memory cells, wherein the voltage regulator uses the measuring voltage in controlling the voltage of the regulated node;
   wherein the second plurality of memory cells are usable to store retrievable data.

8. A circuit comprising:
   a first plurality of memory cells, each memory cell of the first plurality of memory cells including a voltage supply terminal coupled to a regulated node;
   a second plurality of memory cells;
   a voltage regulator coupled to the regulated node to control a voltage of the regulated node, the voltage regulator comprising:
      a leakage current measuring circuit, the leakage current measuring circuit including a reference node for providing a measuring voltage that is dependent upon a measured leakage current of the second plurality of memory cells, wherein the voltage regulator uses the measuring voltage in controlling the voltage of the regulated node;
   a voltage clamp coupled to the reference node for preventing the measuring voltage of the reference node form rising above a particular value.

9. The circuit of claim 8 wherein the voltage regulator further comprises:
   a regulating transistor having a first current terminal coupled to the regulated node and a second current terminal coupled to a power supply node;
   an operational amplifier circuit including an inverting input coupled to the reference node, a non-inverting input coupled to the regulated node, and an output coupled to a control terminal of the regulating transistor.

10. A circuit comprising:
a first plurality of memory cells, each memory cell of the first plurality of memory cells including a voltage supply terminal coupled to a regulated node;
a second plurality of memory cells;
a voltage regulator coupled to the regulated node to control a voltage of the regulated node, the voltage regulator comprising:
a leakage current measuring circuit, the leakage current measuring circuit including a reference node for providing a measuring voltage that is dependent upon a measured leakage current of the second plurality of memory cells, wherein the voltage regulator uses the measuring voltage in controlling the voltage of the regulated node;
at least one switch for selectively coupling at least some of the second plurality of memory cells to the reference node in a first switch position and for coupling the at least some of the second plurality of memory cells to the regulated node in a second switch position.

11. A circuit comprising:
a first plurality of memory cells, each memory cell of the first plurality of memory cells including a voltage supply terminal coupled to a regulated node;
a second plurality of memory cells;
a voltage regulator coupled to the regulated node to control a voltage of the regulated node, the voltage regulator comprising:
a leakage current measuring circuit, the leakage current measuring circuit including a reference node for providing a measuring voltage that is dependent upon a measured leakage current of the second plurality of memory cells, wherein the voltage regulator uses the measuring voltage in controlling the voltage of the regulated node;
an enablement transistor having a first current terminal coupled to the regulated node, a second current electrode coupled to a power supply terminal, and a control terminal for receiving an enablement signal that when in a first state, makes the enablement transistor conductive to pull a voltage of the regulated node to a voltage of the power supply node regardless of the measuring voltage.

12. The circuit of claim 11 wherein the enablement transistor is conductive when a cell of the first plurality of memory cells is being accessed and is non-conductive when no cell of the first plurality of memory cell is being accessed.

13. A circuit comprising:
a first plurality of memory cells, each memory cell of the first plurality of memory cells including a voltage supply terminal coupled to a regulated node;
a second plurality of memory cells;
a voltage regulator coupled to the regulated node to control a voltage of the regulated node, the voltage regulator comprising:
a leakage current measuring circuit, the leakage current measuring circuit including a reference node for providing a measuring voltage that is dependent upon a measured leakage current of the second plurality of memory cells, wherein the voltage regulator uses the measuring voltage in controlling the voltage of the regulated node;
a resistive circuit having one terminal connected to the reference node and a second terminal connected to a power supply terminal, wherein the measuring voltage is determined by the measured leakage current from the second plurality of memory cells flowing though the resistive circuit.

14. The circuit of claim 13 wherein the voltage regulator further comprises:
a regulating transistor having a first current terminal coupled to the regulated node and a second current terminal coupled to a power supply node;
an operational amplifier circuit including an inverting input coupled to the reference node, a non-inverting input coupled to the regulated node, and an output coupled to a control terminal of the regulating transistor.

15. The circuit of claim 13 wherein the resistive circuit is a programmable.

16. A circuit comprising:
a first plurality of memory cells, each memory cell of the first plurality of memory cells including a voltage supply terminal coupled to a regulated node;
a second plurality of memory cells;
a voltage regulator coupled to the regulated node to control the voltage of the regulated node to control the voltages across the cells of the first plurality of memory cells, the voltage regulator comprising:
a leakage current measuring circuit, the leakage current measuring circuit including a reference node for providing a measuring voltage that is dependent upon a measured leakage current of the second plurality of memory cells, wherein the voltage regulator uses the measuring voltage in controlling the voltages across the cells of the first plurality of memory cells to control the leakage current of the first plurality of memory cells;
a regulating transistor having a first current terminal coupled to the regulated node and a second current terminal coupled to a power supply node;
an operational amplifier circuit including an inverting input coupled to the reference node, a non-inverting input coupled to the regulated node, and an output coupled to a control terminal of the regulating transistor.

17. The circuit of claim 16 wherein the memory cells of the first plurality of memory cells are characterized as SRAM cells.

18. The circuit of claim 16 wherein the memory cells of the first plurality of memory cells each include a pair of cross coupled inventers with a high voltage terminal and a low voltage terminal, where the voltage across a cell is characterized by a voltage differential between the high voltage terminal and the low voltage terminal.

19. The circuit of claim 16 wherein the second plurality of memory cells are dummy memory cells.

20. A circuit comprising:
a first plurality of memory cells, each memory cell of the first plurality of memory cells including a voltage supply terminal coupled to a regulated node;
a second plurality of memory cells;
a voltage regulator coupled to the regulated node to control the voltage of the regulated node to control the voltages across the cells of the first plurality of memory cells, the voltage regulator comprising:
a leakage current measuring circuit, the leakage current measuring circuit including a reference node for providing a measuring voltage that is dependent upon a measured leakage current of the second plurality of memory cells, wherein the voltage regulator uses the measuring voltage in controlling the voltages across the cells of the first plurality of memory cells to control the leakage current of the first plurality of memory cells;
wherein the second plurality of memory cells are usable to store retrievable data.

21. The circuit of claim 20 wherein the voltage regulator further comprises:
- a regulating transistor having a first current terminal coupled to the regulated node and a second current terminal coupled to a power supply node;
- an operational amplifier circuit including an inverting input coupled to the reference node, a non-inverting input coupled to the regulated node, and an output coupled to a control terminal of the regulating transistor.

* * * * *